(12) United States Patent
Ito

(10) Patent No.: US 11,306,001 B2
(45) Date of Patent: Apr. 19, 2022

(54) POLYCRYSTALLINE SILICON ROD AND METHOD FOR PRODUCING SAME

(71) Applicant: MITSUBISHI MATERIALS CORPORATION, Tokyo (JP)

(72) Inventor: Kazuyuki Ito, Yokkaichi (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 122 days.

(21) Appl. No.: 16/310,532

(22) PCT Filed: Jun. 21, 2017

(86) PCT No.: PCT/JP2017/022783
§ 371 (c)(1),
(2) Date: Dec. 17, 2018

(87) PCT Pub. No.: WO2017/221952
PCT Pub. Date: Dec. 28, 2017

(65) Prior Publication Data
US 2019/0248657 A1    Aug. 15, 2019

(30) Foreign Application Priority Data
Jun. 23, 2016  (JP) .............................. JP2016-124042

(51) Int. Cl.
*C01B 33/035*  (2006.01)
*C01B 33/02*  (2006.01)
(Continued)

(52) U.S. Cl.
CPC ............ *C01B 33/035* (2013.01); *C01B 33/02* (2013.01); *C23C 16/24* (2013.01); *C23C 16/46* (2013.01)

(58) Field of Classification Search
CPC ....... C01B 33/035; C01B 33/02; C23C 16/24; C23C 16/46
(Continued)

(56) References Cited

U.S. PATENT DOCUMENTS 3,501,336 A    3/1970  Dyer et al.
3,679,470 A *  7/1972  Rogers .................... C30B 25/02
                                                               427/588
(Continued)

FOREIGN PATENT DOCUMENTS

DE           64047 A1    10/1968
EP        2551239 A1     1/2013
(Continued)

OTHER PUBLICATIONS

Korean Office Action dated Mar. 15, 2021, issued for Korean Patent Application No. 10-2018-7032879 and English translation thereof.
(Continued)

*Primary Examiner* — Sheng H Davis
*Assistant Examiner* — Michael Forrest
(74) *Attorney, Agent, or Firm* — Locke Lord LLP

(57) ABSTRACT

The present invention provides a polycrystalline silicon rod whose rod surface portion has a phosphorus concentration of 0.015 ppba or less, in which the ratio (P2/P1) of the phosphorus concentration (P2) of the rod center portion to the phosphorus concentration (P1) of the rod surface portion is within the range of 2 or lower. The present invention also provides a method for producing a polycrystalline silicon rod by the Siemens method that assembles a polycrystalline silicon seed rod in a reactor, then heats the seed rod up to a temperature of 1000° C. or more and less than the melting point of silicon by energization heating, and supplies a raw material gas including trichlorosilane gas and hydrogen gas
(Continued)

as the main components to the reactor at the heating temperature to deposit and grow silicon on the seed rod surface.

5 Claims, 2 Drawing Sheets

(51) Int. Cl.
C23C 16/24 (2006.01)
C23C 16/46 (2006.01)
(58) Field of Classification Search
USPC .......................................................... 423/346
See application file for complete search history.

(56) References Cited

U.S. PATENT DOCUMENTS

| | | | |
|---|---|---|---|
| 4,921,026 A | 5/1990 | Flagella et al. | |
| 2009/0297708 A1* | 12/2009 | Tebakari | C01B 33/035 427/255.17 |
| 2013/0011558 A1* | 1/2013 | Haeckl | C01B 33/03 427/255.28 |
| 2013/0189176 A1* | 7/2013 | Wochner | C01B 33/021 423/348 |

FOREIGN PATENT DOCUMENTS

| | | |
|---|---|---|
| JP | S46-2053 | 10/1971 |
| JP | S46-2053 A | 10/1971 |
| JP | S52-133022 A | 11/1977 |
| JP | H2-111613 A | 4/1990 |
| JP | 2005-336045 A | 12/2005 |
| JP | 2010-006689 A | 1/2010 |
| JP | 2012-92008 A | 5/2012 |
| JP | 2013-151413 A | 8/2013 |
| JP | 2015-030628 A | 2/2015 |
| WO | 2014/103939 A1 | 7/2014 |

OTHER PUBLICATIONS

Supplementary European Search Report dated Jan. 22, 2020, issued for European Patent Application No. 17815420.9.
Office Action dated Oct. 20, 2021, issued for Chinese Patent Application No. 201780030859.9 and English translation thereof.

* cited by examiner

POLYCRYSTALLINE SILICON ROD AND METHOD FOR PRODUCING SAME

TECHNICAL FIELD

The present invention relates to a polycrystalline silicon rod used for producing monocrystalline silicon for semiconductor apparatuses as a raw material and a method for producing the polycrystalline silicon rod. This international application claims the priority in accordance with Japan's patent application No. 124042 filed on Jun. 23, 2016 (JP 2016-124042), and the entire contents of the JP 2016-124042 are incorporated by reference in this international application.

BACKGROUND

The production of silicon semiconductors involves monocrystallization of high purity polycrystalline silicon and the use of the resulting monocrystalline silicon as a base material, and due to growing demands for higher performance and higher density in semiconductor products, impurities are desirably reduced as much as possible from polycrystalline silicon used as a raw material. In fact, high purity polycrystalline silicon is produced mainly by the Siemens method that heats a seed rod composed of the high purity polycrystalline silicon in a reactor by energization heating (Joule heating) to deposit silicon on the seed rod surface, rather than a crucible that can be a contaminated source in melt-textured growth process. The Siemens method is characterized in that trichlorosilane with the boiling point being adjacent to the normal temperature and that is easy to purify by distillation is used as a high purity in-process raw material, and silicon is deposited and grown on the surface of a thin polycrystalline silicon seed rod (hereinafter referred to as "seed rod") normally square-shaped with a side of 10 mm or less by reduction-depositing the trichlorosilane to produce a high purity polycrystalline silicon rod of 100 mm or more in diameter. During the depositing process, the purity of the raw material gas supplied to the reactor is controlled to thoroughly eliminate the contaminated source, but when the seed rod is assembled in the reactor, the inside of the reactor is exposed to the atmosphere, which is likely to allow substances contained in the atmosphere to contaminate the seed rod. The countermeasures against this contamination include seed rod assembly in a clean booth and inert gas replacement for the air in the reactor after the assembly process. However, once the reactor is exposed to the atmosphere, a certain amount of contaminated source is inevitably residual, and the purity of the rod center portion near the seed rod interface of the resulting produced polycrystalline silicon rod is lower than the purity of the rod surface portion. Meanwhile, reactor materials used in silicon deposition are generally formed of stainless steel, and it is believed that metallic compounds such as Fe, Ni, and Cr contained in a passive film formed on the surface of stainless steel adhere during polycrystalline silicon deposition.

One conventional method for preventing contamination of a seed rod is disclosed as a method for producing a polycrystalline silicon rod by cleaning a silicon core wire (seed rod), packing the cleaned silicon core wire in a bag one by one, and handling the silicon core wire in a packed state, setting (assembling) the silicon core wire in a reactor, taking out the silicon core wire from the bag and attaching it to an electrode (see e.g., Patent Document 1). The method is believed to be capable of preventing damage or contamination of a silicon core wire when the silicon core is transported, stored, or handled by packing the cleaned silicon core wire one by one.

Disclosed is another method for producing high purity polycrystalline silicon by reducing the oxygen, nitrogen or carbon concentration on the silicon core wire interface in a polycrystalline silicon rod finally obtained by removing an oxide film formed on the silicon core wire surface and a nitrogen or carbon component adhered to the surface (see e.g., Patent Document 2). In this method, after setting a silicon core wire in a reactor (assembling), the air in the reactor is substituted with hydrogen while the supply of a raw material gas for depositing silicon starts, and the surface temperature of the silicon core wire is maintained in the range of a prescribed temperature to remove the oxide film formed on the silicon core wire surface and the nitrogen or carbon component adhered.

Disclosed is another method for avoiding contamination on the thin rod surface by introducing hydrogen halide into a reactor containing at least one thin rod at a temperature of the thin rod of 400 to 1000° C. before depositing silicon on the surface of a thin rod (seed rod), and removing volatile halides and hydrides generated by halogen and hydrogen radicals generated by UV light irradiation (see e.g., Patent Document 3).

Furthermore, disclosed is a method for producing high-purity monocrystalline silicon by introducing a gas corrosive such as gaseous HCl into a reaction chamber before accumulating silicon on the surface of a thin rod (seed rod), allowing the gas corrosive to pass on the monocrystalline silicon rod to corrode the silicon rod surface, and subsequently introducing a gas mixture containing silicon halide and hydrogen together with the gas corrosive (see e.g., Patent Document 4). In this method, the silicon rod surface is removed by 1 to 15 μm thick to deposit monocrystalline silicon containing no polycrystalline silicon.

PRIOR ART DOCUMENTS

Patent Documents

Patent Document 1: JP-A-2015-030628 (claim 1, para. [0018])
Patent Document 2: WO2014/103939 (claim 4, paras. to [0059])
Patent Document 3: JP-A-2012-92008 (claim 1, paras. [0019], [0020], and [0051])
Patent Document 4: JP-A-S46-2053 (CLAIMS)

SUMMARY OF THE INVENTION

Problem to be Solved by the Invention

However, the method disclosed in Patent Document 1 is effective as a method for reducing contamination of the silicon core wire surface before setting the silicon core wire in a reactor, but depending on the environment or atmosphere in the reactor after taking out the silicon core wire from a bag and setting the silicon core wire in the reactor, or the setting time, the silicon core wire is inevitably contaminated, and the use of a contaminated silicon core wire fails to produce high purity silicon deposited on the core wire, resulting in needs for further improvement.

The method disclosed in Patent Document 2 can remove an oxide film formed on the silicon core wire surface, and a nitrogen or carbon component adhered to the surface, but the method fails to mention metallic impurities on the silicon core wire surface, particularly a phosphorus component. In addition, the method disclosed in Patent Document 3 introduces hydrogen halide into a reactor, and introduces a lamp for UV light irradiation into the reactor, resulting in further contamination. The use of hydrogen halide causes problems to be solved such as preparation of means for obtaining a high-purity hydrogen halide and equipment for treating discharged gas, and other countermeasures against contamination from a line for introducing hydrogen halide.

In the method disclosed in Patent Document 3, the concentration of phosphorus as typical impurities on a seed rod is 26 ppta (0.026 ppba), thereby requiring measures for further reduction in impurities.

The method disclosed in Patent Document 4 is aimed at evaporating (depositing) monocrystalline silicon on a monocrystalline silicon rod, but the method fails to mention how to remove impurities from the deposited polycrystalline silicon rod surface, thereby failing to provide clear-cut effects in application for a core rod of polycrystalline silicon.

When a seed rod is assembled in a reactor as described above, the seed rod is exposed to the atmosphere, therefore contamination is inevitable. In order to avoid this situation, a method for preventing the seed rod from exposure to the atmosphere is required, which involves work environment and large-scale equipment remodeling. Inventors of the present invention came up with a method for reducing contamination in seed rod assemble without relatively large-scale equipment remodeling. Based on the method, the present invention was accomplished.

An object of the present invention is to provide a polycrystalline silicon rod having particularly small difference in phosphorus concentration by reducing the contamination of a rod center portion to reduce the difference in contamination level from a rod surface portion and allowing the whole rod to uniformly deposit silicon, and a method for producing the polycrystalline silicon rod.

Means for Solving the Problem

A first aspect of the present invention is a polycrystalline silicon rod whose rod surface portion has a phosphorus concentration of 0.015 ppba or less, in which the ratio (P2/P1) of the phosphorus concentration (P2) of the rod center portion to the phosphorus concentration (P1) of the rod surface portion is within the range of 2 or lower.

A second aspect of the present invention is a method for producing a polycrystalline silicon chunk by crushing the polycrystalline silicon rod according to the first aspect.

A third aspect of the present invention is a method for producing a polycrystalline silicon rod by the Siemens method that assembles a polycrystalline silicon seed rod in a reactor, then heats the seed rod up to a temperature of 1000° C. or more and less than the melting point of silicon by energization heating, and supplies a raw material gas including trichlorosilane gas and hydrogen gas as the main components to the reactor at the heating temperature to deposit and grow silicon on the seed rod surface, in which the seed rod is heated up to a temperature of 1000° C. or more and less than the melting point of silicon, and then a mixed gas of silicon tetrachloride gas and hydrogen gas is supplied to the reactor for at least 10 min. with the reactor wall temperature maintained at 30° C. or more to etch the surface of the seed rod in the reactor, and a raw material gas including trichlorosilane gas and hydrogen gas as the main components is subsequently supplied at the heating temperature.

A fourth aspect of the present invention, the invention according to the third aspect, is a method for producing a polycrystalline silicon rod, and the produced polycrystalline silicon rod has a bulk metal impurity of iron (Fe) concentration of 0.04 ppbw or less, a bulk metal impurity of nickel (Ni) concentration of 0.007 ppbw or less, and a bulk metal impurity of chromium (Cr) concentration of 0.005 ppbw or less.

A fifth aspect of the present invention, the invention according to the third aspect, is a method for producing a polycrystalline silicon rod, in which the silicon tetrachloride gas supplied to the reactor is a silicon tetrachloride gas purified by recovering the gas containing silicon tetrachloride discharged from the reactor and separating components except the silicon tetrachloride gas from the gas containing silicon tetrachloride.

A sixth aspect of the present invention, the invention according to the third or fourth aspect, is a method for producing a polycrystalline silicon rod, in which a mixed gas of silicon tetrachloride gas and hydrogen gas is supplied to the reactor during which the pressure in the reactor is maintained at 0.1 MPaG or less.

A seventh aspect of the present invention, is an apparatus for producing a polycrystalline silicon rod by the method according to the sixth aspect, in which equipment for treating a mixed gas such as chlorosilane gas, hydrogen gas, and hydrogen chloride gas containing silicon tetrachloride gas discharged from a reactor includes two systems: a first processor for receiving a reactant exhaust gas of 0.1 MPaG or more and a second processor for receiving a reactant gas of less than 0.1 MPaG, and when a mixed gas of the silicon tetrachloride gas and the hydrogen gas is supplied to the reactor, the pressure in the reactor is maintained at less than 0.1 MPaG, the reactant exhaust gas line is switched to the second processor, and when a raw material gas including trichlorosilane gas and hydrogen gas as the main components is supplied, the pressure in the reactor is maintained at 0.1 MPaG or more, and the reactant exhaust gas line is switched to the first processor.

Effect of the Invention

The polycrystalline silicon rod of the first aspect of the present invention is characterized in that since the ratio (P2/P1) of the phosphorus concentration (P2) of the rod center portion to the phosphorus concentration (P1) of the rod surface portion is within the range of 2 or lower, silicon is uniformly deposited so as to have a small difference in phosphorus concentration from the inside of the polycrystalline silicon rod over the entire outer periphery.

The method for producing a polycrystalline silicon chunk of the second aspect of the present invention is a method for crushing a polycrystalline silicon rod having a small difference between the phosphorus concentration of the rod center portion and the phosphorus concentration of the rod surface portion of the first aspect, allowing the obtained polycrystalline silicon chunk to be uniform and have low phosphorus concentration, and the chunk can be used as a high quality raw material for producing monocrystalline silicon as a base material for semiconductor materials.

In the method for producing a polycrystalline silicon rod of the third aspect of the present invention, the surface of the polycrystalline silicon seed rod is etched by silicon tetrachloride gas because a mixed gas of silicon tetrachloride gas and hydrogen gas is supplied to the reactor before supplying a raw material gas including trichlorosilane gas and hydrogen gas as the main components. When silicon is deposited and grown on the surface of the seed rod, a polycrystalline silicon rod, having a small difference between the phosphorus concentration of rod center portion and the phosphorus concentration of the rod surface portion, is obtained. Namely, the silicon quality adjacent to the seed rod including the seed rod of polycrystalline silicon is improved, and a polycrystalline silicon rod overall uniform from the rod center portion to the rod surface portion can be produced. The above etching that is conducted for 10 min. or more with the reactor wall temperature maintained at 30° C. or more provide effects of cleaning metallic compounds such as Fe, Ni, and Cr contained in a passive film generated on the surface of stainless steel that constitutes the reactor using silicon tetrachloride gas. This process reduces metallic impurities taken during the deposition on the polycrystalline silicon rod.

The method for producing a polycrystalline silicon rod of the fourth aspect of the present invention is characterized in that as to the produced polycrystalline silicon rod, the bulk metal impurity of iron (Fe) concentration is 0.04 ppbw or less, the bulk metal impurity of nickel (Ni) concentration is 0.007 ppbw or less, and the bulk metal impurity of chromium (Cr) concentration is 0.005 ppbw or less, because metallic impurities taken during the deposition on the polycrystalline silicon rod are reduced.

In the method for producing a polycrystalline silicon rod of the fifth aspect of the present invention has an advantage that silicon tetrachloride gas supplied to a reactor is purified by recovering the gas containing silicon tetrachloride discharged from the reactor as a by-product during silicon deposition and separating components except the silicon tetrachloride gas from the recovered gas, there are advantages of efficient utilization of the by-product and no need for large-scale equipment remodeling.

In the method for producing a polycrystalline silicon rod of the sixth aspect of the present invention, while a mixed gas of silicon tetrachloride gas and hydrogen gas is supplied to the reactor, the pressure in the reactor is maintained at 0.1 MPaG or less to prevent silicon tetrachloride gas from condensing on the inner wall surface of a reactor and then control the rise of reactor wall temperature.

In the apparatus for producing a polycrystalline silicon rod of the seventh aspect of the present invention, equipment for treating a mixed gas such as chlorosilane gas, hydrogen gas, and hydrogen chloride gas including silicon tetrachloride gas discharged from a reactor includes two systems: a first processor for receiving a reactant exhaust gas of 0.1 MPaG or more to purify by distillation the reactant exhaust gas and a second processor for receiving a reactant gas of less than 0.1 MPaG to purify by distillation the reactant exhaust gas, and when impurities are removed from the seed rod surface before silicon deposition, the second processor treats the reactant exhaust gas, and when silicon is deposited, the first processor treats the reactant exhaust gas. Accordingly, etching reaction and silicon deposition and growth reaction can be produced respectively at appropriate different pressures.

DESCRIPTION OF THE PREFERRED EMBODIMENTS

A polycrystalline silicon rod of an embodiment of the present invention and a method for producing the same will be described with reference to the drawings.

[Polycrystalline Silicon Rod]

A polycrystalline silicon rod of this embodiment has the phosphorus (P) concentration of the rod surface portion of 0.015 ppba or less, and the ratio (P2/P1) of the phosphorus concentration (P2) of the rod center portion to the phosphorus concentration (P1) of the rod surface portion is within the range of 2 or lower. A polycrystalline silicon rod having a phosphorus concentration of the rod surface portion of 0.015 ppba or less can be achieved by a silicon deposition reaction in a closed system for thoroughly eliminating contamination using trichlorosilane (TCS) sufficiently purified by distillation as a raw material. When the above phosphorus concentration ratio (P2/P1) exceeds 2, the rod center portion shows a wider difference in phosphorus concentration than the rod surface portion, thereby failing to obtain polycrystalline silicon rod overall uniform from the rod center portion to the rod surface portion. The phosphorus concentration ratio (P2/P1) is preferably in the range of 1.0 to 1.6. Herein, the rod center portion refers to a region of up to 20 mm in diameter centering around a seed rod including the seed rod of the polycrystalline silicon rod, and the rod surface portion refers to a region extending 5 to 10 mm from the surface of the polycrystalline silicon rod toward the rod center portion. In addition, the above phosphorus concentration is the average measured value in several positions of the above rod center portion and the rod surface portion in circumference.

[Method for Producing a Polycrystalline Silicon Chunk]

A polycrystalline silicon chunk of this embodiment (hereinafter referred to as "silicon chunk") has the phosphorus concentration of the rod surface portion of 0.015 ppba or less, and produced by crushing the entire polycrystalline silicon rod having the above phosphorus concentration ratio (P2/P1) into pieces of 3 to 150 mm. The rod is crushed with tools such as hammers or crushing machines such as crushers. Crushed silicon chunks may cause surface contamination due to contact of crushing tools or crushing machines with the surface during a crushing process. Consequently, a crushed silicon chunk is etched with a chemical and rinsed with pure water to remove the chemical or metallic impurities adhered on the surface of the silicon chunk and clean the silicon chunk. The chemical used for etching is an acid solution such as a mixed acid of hydrofluoric acid and nitric acid. Accordingly, the polycrystalline silicon chunk in the form of chunk has a low phosphorus concentration and a low metallic impurities concentration, the uniform quality is maintained, and the polycrystalline silicon chunk is used as a raw material of monocrystalline silicon by drying and packing.

[Method for Producing a Polycrystalline Silicon Rod]

Figure 1:
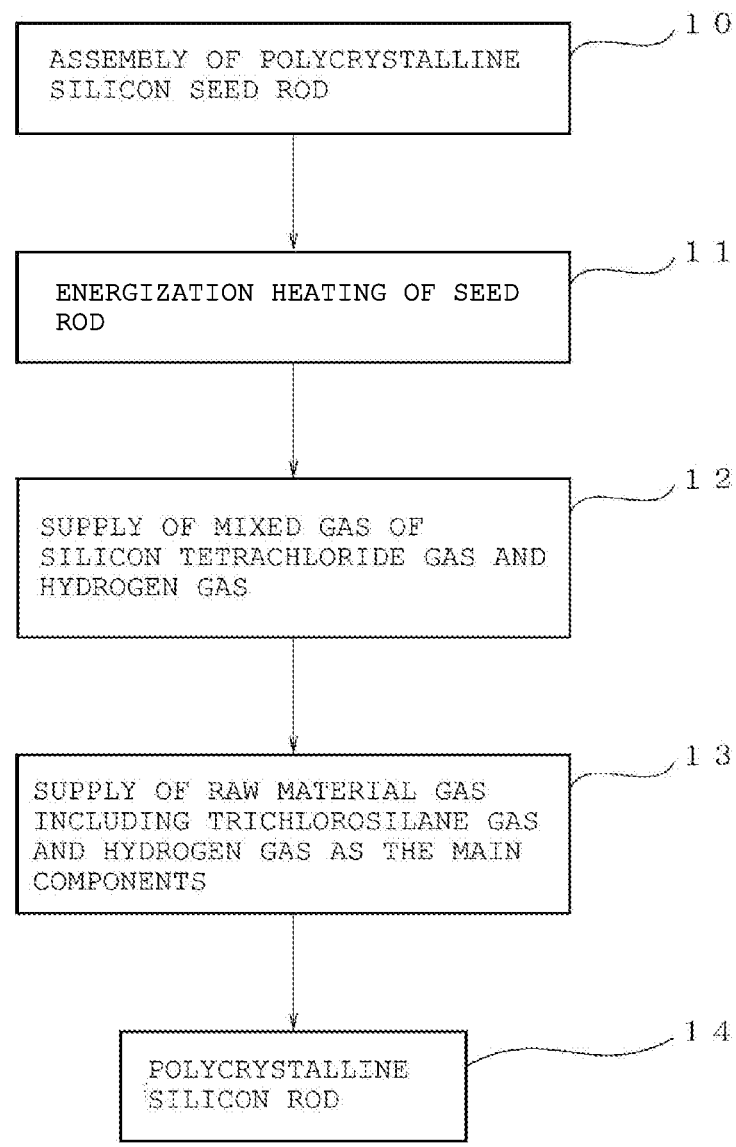
FIG. 1 is a diagram illustrating a producing process of a polycrystalline silicon rod of this embodiment.

One example for producing a polycrystalline silicon rod of this embodiment will be described as follows. This production method, as illustrated in FIG. 1, takes an assembling step 10 of a polycrystalline silicon seed rod, an energization heating step 11 of the seed rod, a supplying step 12 of a mixed gas of silicon tetrachloride gas and hydrogen gas, and a supplying step 13 of a raw material gas including trichlorosilane (TCS) gas and hydrogen gas as the main components to obtain a polycrystalline silicon rod 14.

A polycrystalline silicon seed rod used in this embodiment is cut from e.g., a polycrystalline silicon rod having a bulk metal impurity of phosphorus (P) concentration of 0.02 ppba or less to be 7 to 10 mm square cross-section shape and 2000 mm or so in length. When the bulk metal impurity of phosphorus (P) concentration exceeds 0.02 ppba, it is not likely the phosphorus concentration ratio (P2/P1) of the rod center portion to the rod surface portion is 2 or lower in the production of a polycrystalline silicon rod from the seed rod. Therefore, the seed rod, before being assembled in a reactor, the surface contamination due to processing or handling of the seed rod is treated with a chemical to remove impurities. Illustrative example of the chemical used includes an acid solution such as a mixed acid solution of hydrofluoric acid and nitric acid. Subsequently, after removing the chemical or metallic impurities with pure water, the seed rod surface is dried, and the seed rod is seal-packed to avoid as much contamination as possible.

In the assembling step 10 of a polycrystalline silicon seed rod, two polycrystalline silicon seed rods are installed on at least one pair of electrodes arranged at the inner bottom portion of a reactor (not shown) to be installed upright, respectively, and in this state, a connecting member connects the upper end portions of these two seed rods to be assembled in the form of Π shape style. When the seed rods are installed on the electrodes in the reactor to be installed upright, the surface contamination of the seed rod is prevented as much as possible using clean gloves in possibly clean environment. At this stage, if the surface contamination level is large, residual impurities in the reactor will increase, resulting in no expected effects.

In the electrically heating step 11 of the seed rod, after the seed rod is assembled in the reactor, inert gas is supplied for replacement in the reactor. After the seed rod is preheated with a heater placed in the reactor, the seed rod is electrically heated. Specifically, the current is applied from the above electrodes to the polycrystalline silicon seed rod to heat the polycrystalline silicon seed rod up to a surface temperature of the seed rod in inert gas atmosphere of 1000° C. or more and less than the melting point of silicon. Preferably, the heating time is 10 to 60 min., and the pressure in the reactor is 0.04 to 0.1 MPaG. When the heating temperature is less than 1000° C., the etching rate on the seed rod surface is reduced, which fails to completely remove impurities from the seed rod surface. When the heating temperature exceeds 1400° C., the temperature is closer to the melting temperature of the seed rod, so it is preferably 1400° C. or less. When the heating time is less than 10 min., impurities cannot be completely removed from the seed rod surface, and when the heating time exceeds 60 min., the resulting losses increase due to the etching on the seed rod surface, and power consumption increases due to extended reaction, resulting in growing operation costs. When the pressure in the reactor is less than 0.04 MPaG, it is difficult to allow the following step to feed out gas into exhaust gas treatment equipment, and when the pressure in the reactor exceeds 0.1 MPaG, silicon tetrachloride in the supplied gas is likely to condensate in the reactor, which fails to maintain the volume concentration of an aimed silicon tetrachloride gas.

The characteristic configuration of this embodiment lies in the supplying step 12 for supplying a mixed gas of silicon tetrachloride gas and hydrogen gas. The step 12 maintains the heating temperature and the pressure in the reactor of the step 11, and supplies a mixed gas of silicon tetrachloride gas (STC) and hydrogen gas to the reactor for 10 min. or longer in a hydrogen gas atmosphere with the reactor wall temperature maintained at 30° C. or more. The silicon tetrachloride gas refers to a gas for etching a seed rod surface layer, and the hydrogen gas refers to a carrier gas.

As to the rate of the STC gas and the hydrogen gas in the step 12, the concentration of the STC gas is preferably 20 volume percent or more and 90 volume percent or less in the mixed gas of STC gas and hydrogen gas. When the concentration of the STC gas is 20 volume percent or more, it is assumed that the silicon surface can assuredly be etched, thereby assuredly removing contamination from the seed rod surface. When the concentration of the STC gas is less than 20 volume percent, the etching rate of the silicon surface is lower, causing, on the contrary, deposition reaction to take in impurities. However, since silicon deposition rate using the STC gas is lower than the mixed gas of TCS gas and hydrogen gas, contamination due to metals such as Fe, Ni, and Cr tends to be reduced. When the concentration of the STC gas exceeds 90 volume percent, the STC gas in the mixed gas is likely to condense in a supplying line or a reactor, thereby failing to stably operate the reactor by possibly difficult maintenance of an aimed STC gas volume concentration and generation of a STC liquid paddle in unexpected positions. When a mixed gas of STC gas and hydrogen gas is supplied, it is not necessary to keep the concentration of the STC gas constant, and the concentration can be varied in the range of 20 volume percent or more.

Preferably, a mixed gas of the above-described STC gas concentration is supplied to a reactor for at least 10 min. in the above temperature range. The supplying time is preferably in the range of 10 to 60 min., because impurities sometimes cannot be completely removed from the seed rod surface when the time is short at less than 10 min. In order to efficiently remove impurities from the seed rod surface, the reactor wall temperature is preferably at least 30° C. or more. The temperature is more preferably 40° C. or more and 80° C. or less. This is because since STC gas used for removing impurities is in the form of a liquid at normal temperature with the boiling point of 57.6° C., and when it is supplied to the reactor with a concentration of 25 volume percent or more, the STC gas is condensed on the reactor wall with a low reactor wall surface temperature, resulting in lower STC gas concentration in the reactor, which can fail to obtain expected etching effects on the seed rod surface.

[Polycrystalline Silicon Rod Produced by a Method for Producing a Polycrystalline Silicon Rod]

In a polycrystalline silicon rod produced after etching the seed rod surface with a mixed gas of STC gas and hydrogen gas by the above method, the bulk metal impurity of Fe concentration is 0.04 ppbw or less, the bulk metal impurity of Ni concentration is 0.007 ppbw or less, and the bulk metal impurity of Cr concentration is 0.005 ppbw or less. So long as the STC gas concentration is 20 volume percent or more and 90 volume percent or less, the time for supplying the mixed gas of STC gas and hydrogen gas is 10 min. or more, and the reactor wall temperature is 30° C. or more during etching, the bulk metallic impurities concentration is in the above range.

In the supplying step 13 of a raw material gas including trichlorosilane (TCS) gas and hydrogen gas as the main components, a raw material gas including trichlorosilane (TCS) gas and hydrogen gas as the main components is supplied to a reactor, and silicon is deposited and grown on the seed rod surface to produce a polycrystalline silicon rod by thermal decomposition or reduction reaction of trichlorosilane (TCS) gas on the seed rod surface by energization heating. Herein, the Siemens method employs TCS gas and hydrogen gas as a raw material gas, but this method generates STC gas, hydrogen gas, or hydrogen chloride gas by TCS thermal decomposition or reduction reaction during silicon deposition reaction, and a reactant exhaust gas contains TCS gas or hydrogen gas, which did not contribute to the reaction. Preferably, as to STC gas used in the present invention, the STC gas contained in the reactant exhaust gas is recovered and purified by distillation and mixed with hydrogen gas for use. In this case, since the recovered STC gas comes from a reaction system, it can readily be obtained, and it can be used as a STC gas of stable quality due to the generation from the system. In addition, as to hydrogen in a mixed gas, the hydrogen contained in the reactant exhaust gas is preferably recovered and purified for use.

Moreover, during silicon deposition reaction by TCS gas and hydrogen gas, higher pressure is advantageous in a reactor, the pressure is preferably set higher than the normal pressure to prevent the outside air from coming therein, and it is preferably 0.5 to 0.6 MPaG or so. Meanwhile, when the pressure in the reactor is e.g., 0.1 MPaG or more, the reactor wall temperature must be maintained at 50° C. or more to cause no condensation of STC gas on the reactor wall surface. However, a temperature of 50° C. or more not only increases loads on work environment, but also causes contamination in the reactor due to outgassing from the reactor wall and thermal effects on a reactor sealing member, it is preferable to adjust the pressure in the reactor at less than 0.1 MPaG and the reactor wall temperature at 80° C. or less. Therefore, the treatment of the reactant exhaust gas at a pressure in the reactor of less than 0.1 MPaG preferably prepares lower-pressure exhaust gas treatment equipment.

[Apparatus for Producing a Polycrystalline Silicon Rod]

Figure 2:
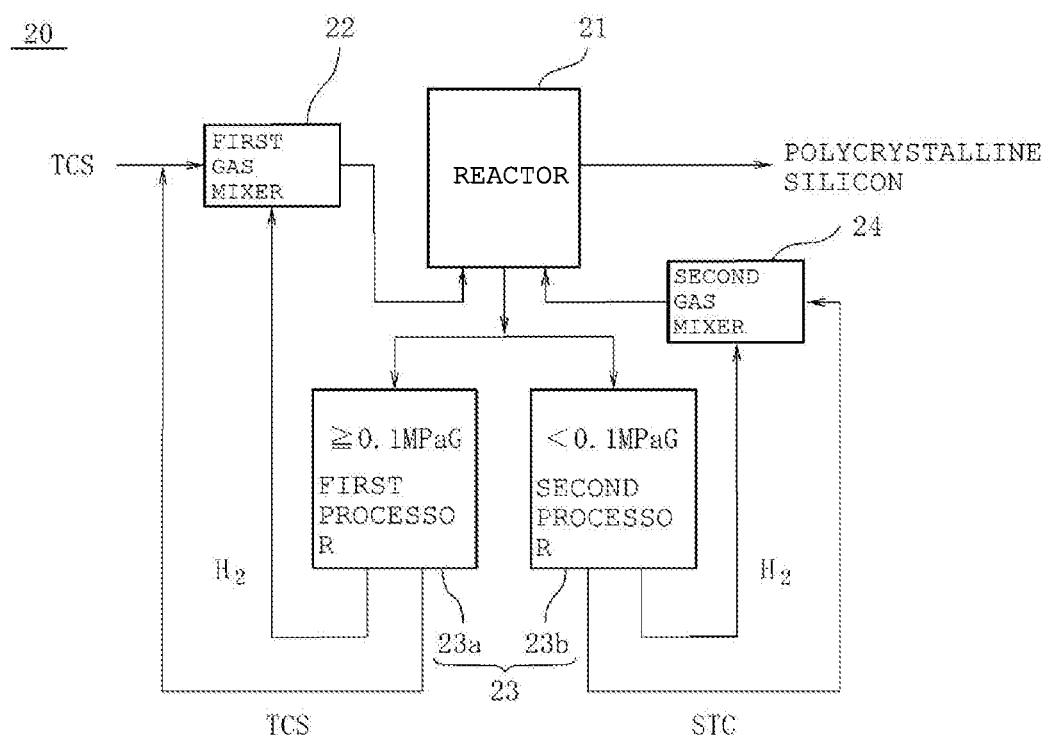
FIG. 2 is a configuration diagram illustrating equipment for producing a polycrystalline silicon rod of this embodiment.

FIG. 2 illustrates an apparatus for producing a polycrystalline silicon rod of this embodiment including the preferable exhaust gas treatment equipment. As illustrated in FIG. 2, the production apparatus 20 includes a reactor 21 for depositing polycrystalline silicon. A first gas mixer 22 for mixing trichlorosilane gas and hydrogen gas is connected to a gas supply port provided at the bottom portion of the reactor 21. The production apparatus 20 includes treatment equipment 23 for a mixed gas of chlorosilane gas and hydrogen gas discharged from the reactor 21. The reactant exhaust gas treatment equipment 23 includes two systems: a first processor 23a for receiving a reactant exhaust gas with a pressure of 0.1 MPaG or more and a second processor 23b for receiving a reactant exhaust gas with a pressure of less than 0.1 MPaG. The TCS gas and the hydrogen gas recovered and purified by distillation by the treatment equipment 23 are fed back into the above first gas mixer 22. Likewise, the STC gas and the hydrogen gas purified by distillation are introduced into a second gas mixer 24, and mixed therein. The gas mixer 24 is connected to the gas supply port provided at the bottom portion of the reactor 21. The reactor exhaust gas contains the hydrogen chloride gas, which is treated by either of the treatment equipment 23a, 23b. FIG. 2 provides no such description.

In operation, the production apparatus 20 for a polycrystalline silicon rod maintains the pressure in the reactor at less than 0.1 MPaG and switches the reactant exhaust gas line to the second processor 23b when a mixed gas of silicon tetrachloride gas and hydrogen gas is supplied to the reactor 21 via the second gas mixer 24, and on the other hand the apparatus maintains the pressure in the reactor at 0.1 MPaG or more and switches the reactant exhaust gas line to the first processor 23a when a raw material gas including trichlorosilane gas and hydrogen gas as the main components is supplied. Specifically, when impurities are removed from the seed rod surface prior to silicon deposition, it is switched to the second processor 23b that can receive a reactant exhaust gas having a pressure of less than 0.1 MPa, and during silicon deposition reaction, it is switched to the first processor 23a that can receive a reactant exhaust gas having a pressure of 0.1 MPa or more.

Silicon deposition reaction on the seed rod surface in a reactor starts with the supply of a mixed gas of STC gas and hydrogen gas to the reactor, and is followed by the supply of a mixed gas of TCS gas and hydrogen gas by replacing a mixed gas of STC gas and hydrogen gas. In this case, since the seed rod temperature is maintained at 1000° C. or more, initial heating by a heater or the like is not required. As a condition during silicon deposition reaction, a raw material gas is supplied from the reactor bottom portion to inside of the reactor, the seed rod is heated by continuous power supply and silicon is continuously deposited on the seed rod surface to produce a polycrystalline silicon rod in aimed diameter. After a predetermined reaction time elapses, power supply to the seed rod is stopped and the supply of a raw material gas is also stopped to cool the reactor. After the reactor is cooled and before the reactor is opened, hydrogen or inert gas is supplied and distributed for a predetermined period of time to substitute residual gas in the reactor.

EXAMPLES

Then, Examples of the present invention will be described in detail together with Comparative Examples.

Example 1

A seed rod that is cut from a silicon rod having a bulk metal impurity of phosphorus (P) concentration of 0.020 ppba to be an approx. 8 mm square cross-section shape and 2000 mm or so in length is etched in a mixed acid solution of hydrofluoric acid and nitric acid, and the surface is cleaned with pure water. The seed rods are installed on at a pair of electrodes arranged at the inner bottom portion of a reactor to be installed upright, and a connecting member connects the upper end portions of these seed rods to be assembled in the form of Π shape style. Subsequently, the reactor was subjected to inert gas replacement, and after the seed rod was preheated with a heater and then the current was applied to raise the temperature up to approx. 1100° C., and hydrogen gas was fed for 10 min. to discharge the inert gas. Afterward, the hydrogen gas was replaced with a mixed gas of silicon tetrachloride gas and hydrogen gas (25 volume percent STC) to be supplied to the reactor for 10 min. In this state, the reactor wall temperature of the reactor was maintained at 30° C., and the pressure in the reactor was maintained at 0.06 MPaG. Afterward, a mixed gas of STC gas and hydrogen gas was replaced with a raw material gas including TCS gas and hydrogen gas to be supplied to the reactor for approx. 120 hours. Silicon was deposited and grown on the seed rod surface to obtain a polycrystalline silicon rod of approx. 115 mm in diameter.

Example 2

As in Example 1 using a seed rod treated as in Example 1, the seed rod was assembled in the form of Π shape style, the reactor was subjected to inert gas replacement, the seed rod was preheated with a heater and then the current was applied to raise the temperature, and hydrogen gas was fed for 10 min. to discharge the inert gas. Afterward, the hydrogen gas was replaced with a mixed gas of silicon tetrachloride gas and hydrogen gas (50 volume percent STC) to be supplied to the reactor for 30 min. In this state, the reactor wall temperature of the reactor was maintained at 80° C., and the pressure in the reactor was maintained at 0.07

MPaG. Afterward, a mixed gas of STC gas and hydrogen gas was replaced with a raw material gas including TCS gas and hydrogen gas to be supplied to the reactor for approx. 120 hours. Silicon was deposited and grown on the seed rod surface to obtain a polycrystalline silicon rod of approx. 117 mm in diameter.

Example 3

As in Example 1 using a seed rod treated as in Example 1, the seed rod was assembled in the form of Π shape style, the reactor was subjected to inert gas replacement, the seed rod was preheated with a heater and then the current was applied to raise the temperature, and hydrogen gas was fed for 10 min. to discharge the inert gas. Afterward, the hydrogen gas was replaced with a mixed gas of silicon tetrachloride gas and hydrogen gas (65 volume percent STC) to be supplied to the reactor for 20 min. In this state, the reactor wall temperature of the reactor was maintained at 80° C., and the pressure in the reactor was maintained at 0.08 MPaG. Afterward, a mixed gas of STC gas and hydrogen gas was replaced with a raw material gas including TCS gas and hydrogen gas to be supplied to the reactor for approx. 120 hours. Silicon was deposited and grown on the seed rod surface to obtain a polycrystalline silicon rod of approx. 122 mm in diameter.

Comparative Example 1

As in Example 1 using a seed rod treated as in Example 1, the seed rod was assembled in the form of Π shape style. The reactor was subjected to inert gas replacement, the seed rod was preheated with a heater and then the current was applied to raise the temperature up to 1100° C., and hydrogen gas was fed for 10 min. to discharge the inert gas. Afterward, a mixed gas of STC gas and hydrogen gas was not supplied to the reactor, and the hydrogen gas was replaced with a raw material gas including TCS gas and hydrogen gas to be supplied to the reactor for approx. 120 hours. Silicon was deposited and grown on the seed rod surface to obtain a polycrystalline silicon rod of approx. 120 mm in diameter.

Comparative Example 2

As in Example 1, using a seed rod treated as in Example 1, the seed rod was assembled in the form of Π shape style, the reactor was subjected to inert gas replacement, the seed rod was preheated with a heater and then the current was applied to raise the temperature up to 1100° C., and hydrogen gas was fed for 10 min. to discharge the inert gas. Afterward, the hydrogen gas was replaced with a mixed gas of silicon tetrachloride gas and hydrogen gas (10 volume percent STC) to be supplied to the reactor for 10 min. In this state, the reactor wall temperature of the reactor was maintained at 15° C., and the pressure in the reactor was maintained at 0.08 MPaG. Afterward, a mixed gas of STC gas and hydrogen gas was replaced with a raw material gas including TCS gas and hydrogen gas to be supplied to the reactor for approx. 120 hours. Silicon was deposited and grown on the seed rod surface to obtain a polycrystalline silicon rod of approx. 120 mm in diameter.

<Comparative Tests and Evaluation>

Five types of polycrystalline silicon rods, obtained in Examples 1 to 3 and Comparative Examples 1 and 2, were each cut into and served as cylinder-shaped specimens. In each of the cylinder-shaped specimens, 2 rods of 12 mm in diameter were cut from each of (a) a rod center portion including the seed rod, (b) a rod surface portion 5 mm inside from the rod surface, and (c) a rod intermediate portion 40 mm inside from the rod surface, these rods were individually crystallized by FZ method, and the phosphorus concentration was measured by PL (Photo luminescence) method according to SEMI MF1389. In addition, specimens were cut from the polycrystalline silicon rods obtained in Examples 1 to 3 and Comparative Examples 1 and 2, and the concentration of bulk metal impurities contained in each of the specimens was measured using ICP-MS. Specifically, three specimens were collected from each of the rods, and the iron (Fe), nickel (Ni) and chromium (Cr) concentrations were measured for each specimen, and the averages were determined. Table 1 shows the averages of the phosphorus concentrations of the two rods, and the averages of the iron (Fe), nickel (Ni) and chromium (Cr) concentrations.

TABLE 1

| | Production condition | | | | Phosphorus concentration (ppba) | | | | Bulk concentration (ppbw) | | |
|---|---|---|---|---|---|---|---|---|---|---|---|
| | STC in mixed gas (vol %) | Mixed gas supply time (min.) | Reactor wall temperature (° C.) | Pressure in the reactor (MPaG) | Rod center portion (P2) | Rod surface portion (P1) | Rod intermediate portion (P3) | Phosphorus concentration ratio (P2/P1) | Fe | Ni | Cr |
| Example 1 | 25 | 10 | 30 | 0.06 | 0.018 | 0.010 | 0.011 | 1.80 | 0.01 | 0.007 | 0.005 |
| Example 2 | 50 | 30 | 60 | 0.08 | 0.018 | 0.011 | 0.013 | 1.64 | 0.02 | 0.007 | 0.005 |
| Example 3 | 65 | 10 | 80 | 0.08 | 0.020 | 0.012 | 0.014 | 1.67 | 0.04 | 0.007 | 0.005 |
| C.E. 1 | — | — | 30 | 0.08 | 0.062 | 0.010 | 0.012 | 6.20 | 0.20 | 0.010 | 0.010 |
| C.E. 2 | 10 | 10 | 15 | 0.08 | 0.043 | 0.010 | 0.016 | 4.30 | 0.05 | 0.009 | 0.012 |

C.E.: Comparative Example

As obviously shown in Table 1, in Comparative Example 1, since a mixed gas of silicon tetrachloride gas and hydrogen gas was not supplied before silicon deposition on the seed rod surface, etching was not carried out, and the ratio (P2/P1) of the phosphorus concentration (P2) of the rod center portion to the phosphorus concentration (P1) of the rod surface portion was 6.20. As to the resulting silicon rod, the bulk metal impurity of Fe concentration was 0.20 ppbw, the bulk metal impurity of Ni concentration was 0.010 ppbw, and the bulk metal impurity of Cr concentration was 0.010 ppbw.

In Comparative Example 2, when a mixed gas of silicon tetrachloride gas and hydrogen gas was supplied, the STC gas concentration was 10 volume percent, and the reactor wall temperature of the reactor was 15° C., resulting in insufficient etching, with the above ratio (P2/P1) of 4.30. As to the resulting silicon rod, the bulk metal impurity of Fe concentration was 0.05 ppbw, the bulk metal impurity of Ni concentration was 0.009 ppbw, and the bulk metal impurity of Cr concentration was 0.012 ppbw.

On the other hand, in Examples 1 to 3, since a mixed gas of silicon tetrachloride gas and hydrogen gas was supplied for 10 min. or longer before silicon deposition on the seed rod surface, with a STC gas concentration of 25 to 65 volume percent and a reactor wall temperature of the reactor of 30° C. or more, etching was sufficient, thereby it was confirmed that providing the above ratio (P2/P1) of 1.64 to 1.80 and an overall uniform polycrystalline silicon rod from the inside of the rod (center portion) to the rod surface portion can be obtained. As to the above silicon rod, the bulk metal impurity of Fe concentration was 0.04 ppbw or less, the bulk metal impurity of Ni concentration was 0.007 ppbw or less, and the bulk metal impurity of Cr concentration was 0.005 ppbw or less, and it was confirmed that a silicon rod having reduced Fe, Ni, and Cr contents can be obtained.

INDUSTRIAL APPLICABILITY

The polycrystalline silicon rod of the present invention can be used as a raw material for producing monocrystalline silicon used in a semiconductor device.

The invention claimed is:

1. A polycrystalline silicon rod whose rod surface portion has a phosphorus concentration of 0.015 ppba or less, wherein a ratio (P2/P1) of a phosphorus concentration (P2) of a rod center portion to a phosphorus concentration (P1) of the rod surface portion is within the range of 1 to 2, wherein the rod center portion is a region of up to 20 mm in diameter centering around a seed rod including the seed rod of the polycrystalline silicon rod, and the rod surface portion is a region extending 5 to 10 mm from the surface of the polycrystalline silicon rod toward the rod center portion.

2. A method for producing a polycrystalline silicon chunk by crushing the polycrystalline silicon rod according to claim 1.

3. A method for producing a polycrystalline silicon rod by the Siemens method comprising:
    assembling a polycrystalline silicon seed rod in a silicon deposition reactor,
    heating the seed rod up to a temperature of 1000° C. or more and less than the melting point of silicon by energization heating, and
    supplying a raw material gas including trichlorosilane gas and hydrogen gas as the main components to the reactor at the heating temperature to deposit and grow silicon on the seed rod surface, wherein
    the seed rod is heated up to a temperature of 1000° C. or more and less than the melting point of silicon, and then a mixed gas of silicon tetrachloride gas and hydrogen gas is supplied to the reactor for at least 10 min with the reactor wall temperature maintained at 30° C. or more and the pressure in the reactor maintained at 0.1 MPaG or less to etch the surface of the seed rod in the reactor, and subsequently a raw material gas including trichlorosilane gas and hydrogen gas as the main components is subsequently supplied at the heating temperature.

4. The method for producing a polycrystalline silicon rod according to claim 3, wherein the produced polycrystalline silicon rod has a bulk metal impurity of iron (Fe) concentration of 0.04 ppbw or less, a bulk metal impurity of nickel (Ni) concentration of 0.007 ppbw or less, and a bulk metal impurity of chromium (Cr) concentration of 0.005 ppbw or less.

5. The method for producing a polycrystalline silicon rod according to claim 3, wherein the silicon tetrachloride gas supplied to the reactor is a silicon tetrachloride gas purified by recovering a gas containing silicon tetrachloride discharged from the reactor and separating components except the silicon tetrachloride gas from the gas containing silicon tetrachloride.

* * * * *